United States Patent
López Bueno et al.

(10) Patent No.: US 9,158,719 B2
(45) Date of Patent: Oct. 13, 2015

(54) HETEROGENEOUS PARALLEL SYSTEMS FOR ACCELERATING SIMULATIONS BASED ON DISCRETE GRID NUMERICAL METHODS

(71) Applicant: AIRBUS OPERATIONS S.L., Madrid (ES)

(72) Inventors: Sergio López Bueno, Madrid (ES); Diego Sánchez Román, Guadalajara (ES); Gustavo Sutter, Colmenar Viejo (ES); Ismael Gómez Garcia, Tres Cantos (ES); Iván González Martínez, Madrid (ES); Francisco Javier Gómez Arribas, Tabanera la Luenga (ES); Javier Aracil Rico, Madrid (ES)

(73) Assignee: AIRBUS OPERATIONS S.L., Madrid (ES)

( * ) Notice: Subject to any disclaimer, the term of this patent is extended or adjusted under 35 U.S.C. 154(b) by 396 days.

(21) Appl. No.: 13/724,335

(22) Filed: Dec. 21, 2012

(65) Prior Publication Data

US 2013/0198426 A1    Aug. 1, 2013

(30) Foreign Application Priority Data

Dec. 22, 2011   (EP) .................................. 11382394

(51) Int. Cl.
*G06F 17/50* (2006.01)
*G06F 13/36* (2006.01)

(52) U.S. Cl.
CPC ............ *G06F 13/36* (2013.01); *G06F 17/5018* (2013.01)

(58) Field of Classification Search
CPC .............................. G06F 13/36; G06F 17/5018
USPC ....................................................... 716/6, 106
See application file for complete search history.

(56) References Cited

U.S. PATENT DOCUMENTS 6,519,553 B1 *   2/2003   Barnette et al. .................... 703/2
7,805,690 B2 *   9/2010   Willis ........................... 716/103
(Continued)

FOREIGN PATENT DOCUMENTS

EP          2 608 084        6/2013

OTHER PUBLICATIONS

Smith et al., "Towards an RCC-based accelerator for computational fluid dynamics applications", Journal of Supercomputing, Dec. 2004, pp. 239-261, vol. 30, No. 3, Kluwer Academic Publishers Netherlands.

Andres et al., "A methodology for CFD acceleration through reconfigurable hardware," 46th AIAA Aerospace Sciences Meeting and Exhibit, Jan. 2008, American Institute of Aeronautics and Astronautics Inc., USA.

Sanchez-Roman, Diego et al., "In-Socket Acceleration for CFDS using High Level Languages," JCRA, 2010, pp. 189-196, 259-265, Madrid, Spain.

(Continued)

*Primary Examiner* — Paul R Myers
(74) *Attorney, Agent, or Firm* — Jenkins, Wilson, Taylor & Hunt, P.A.

(57) ABSTRACT

A system for executing a given scientific code using a suitable finite-volume or finite-element solver for a large dataset represented as a grid, comprising a plurality of equal computing nodes interconnected by node communication means and a parallel computing software package for distributing and controlling the execution in sub-grids among said computing nodes; each computing node comprising at least a CPU-based first processing means and a FPGA-based second processing means interconnected by a bus; said package being configured for the simultaneous execution of at least one first solver process (which is fully executed in a first processing means) and one second solver process (which is fully executed in a second processing means) in each computing node for one sub-grid of said grid and for managing the exchange of boundary data with the solver processes that solve neighbor sub-grids.

15 Claims, 6 Drawing Sheets

(56) References Cited

U.S. PATENT DOCUMENTS

| | | | |
|---|---|---|---|
| 8,255,849 B1* | 8/2012 | Okhmatovski et al. | 716/110 |
| 8,630,829 B1* | 1/2014 | Gaudette et al. | 703/6 |
| 2003/0160980 A1* | 8/2003 | Olsson et al. | 358/1.9 |
| 2005/0288800 A1 | 12/2005 | Smith | |
| 2006/0095246 A1* | 5/2006 | Nagase et al. | 703/22 |
| 2007/0219766 A1 | 9/2007 | Duggleby | |
| 2008/0244476 A1* | 10/2008 | Fotakis et al. | 716/4 |
| 2009/0157364 A1 | 6/2009 | Velazquez Lopez | |

OTHER PUBLICATIONS

Asouti, V.G et al., "Unsteady CFD computations using vertex-centered finite volumes for unstructured grids on Graphics Processing Units," International Journal for Numerical Methods in Fluids, 2011, pp. 232-246.

Extended European Search Report for Application No. EP 11 38 2394 dated Jun. 6, 2012.

* cited by examiner

HETEROGENEOUS PARALLEL SYSTEMS FOR ACCELERATING SIMULATIONS BASED ON DISCRETE GRID NUMERICAL METHODS

CROSS-REFERENCE TO RELATED APPLICATION

This U.S. non-provisional patent application claims priority to European Patent Application No. 11382394.2 filed on Dec. 22, 2011, the entire content of which is incorporated by reference herein.

FIELD OF THE INVENTION

The present invention refers to systems for the execution of computationally intensive physics simulations using finite element or finite volume solvers requiring a huge number of vertices and structured or non-structured grids and, more in particular, to systems for solving the equations of a given scientific code such as one of the codes used in Computational Fluid Dynamics (hereinafter CFD) for a large dataset represented as a grid.

BACKGROUND OF THE INVENTION

A common situation in practical industrial applications related to product development is the need to perform quick surveys inside a space of state parameters. In mature and very competitive industrial sectors like aerospace, this need is motivated by the drive to generate products having good technical performance within design cycles that are as short as is feasible. That is: time is a key factor in industrial competitiveness because shortening the time market may provide a leading economic advantage during the product life cycle.

In the specific case of aeronautics, the prediction of the aerodynamic forces and, more generally, skin surface value distributions experimented by an aircraft is an important feature in order to optimally design its structural components so that the weight of the structure is the minimum possible, but at the same time being able to withstand the expected aerodynamic forces.

Thanks to the increase in the use of CFD the determination of the aerodynamic forces on an aircraft is commonly done by numerically solving the Reynolds Averaged Navier-Stokes equations (RANS equations from now onwards) that model the movement of the flow around the aircraft, using discrete finite element or finite volume models. With the demand of accuracy posed in the aeronautical industry, each one of these computations requires important computational resources.

A first known approach for improving the execution of said equations for a given model is to provide analytical techniques that simplify the calculations needed for arriving to a solution. An example in this respect can be found in US 2009/157364 in the name of the applicant.

A second approach is the use of computer techniques whether for accelerating the calculation process or for optimizing the computational resources needed for solving a given problem.

To accelerate the calculating process it is common to use parallel machines. The grid is partitioned into several sub-grids, which are solved separately. When each temporal iteration is finished, it is necessary to send the values of the variables of boundary vertices to the neighbour vertices. Therefore, as the grid is partitioned into more sub-grids, communications are increasing until a point is reached where the increase in speed by adding more machines is marginal, because most of the time is spent in communications.

The addition of accelerator devices to a conventional computer to improve the execution time of a given algorithm has also been proposed. As a basis for building these devices two technologies have been used: FPGA (Field-Programmable Gate Array) and GP-GPU (General Purpose Graphics Processing Unit). The format of these accelerator devices can be either that of expansion cards such as PCI (Peripheral Component Interconnect) or that of PCI Express (Peripheral Component Interconnect Express) or plug-in modules which fit into the processor socket (in-socket accelerators), such as the XD2000i of XtremeData).

In the accelerator device both the computationally more expensive sections of the algorithm or the entire algorithm can be executed. In particular, US 2007/0219766 discloses the use of a PCI card with a FPGA for accelerating the computationally more expensive sections of the algorithm.

In Reference [1] is disclosed an alternative based on an in-socket accelerator (ISA) which also uses the approach of executing in the FPGA the computationally most expensive sections of the algorithm.

US 2005/0288800 discloses an architecture with several PCI cards interconnected through a dedicated network where a section or the entire algorithm can be executed.

Finally, Reference [2] discloses a solution that executes a Navier-Stokes code completely in GP-GPUs.

However, none of said proposals can achieve the performance required in industrial environments. On the one hand, the proposal that executes only a part of the algorithm in the accelerator devices does not usually obtain good results due to strong communication overload. On the other hand, the number of expansion cards or processor sockets available on a system is limited and therefore so is the overall acceleration that can be achieved in the proposals disclosed in US 2005/0288800 and in Reference [2].

Additionally the proposals aimed to the full execution of the algorithm have significant limitations on the size of the grid that can be processed and/or on the processing speed. Reference [2] shows results for networks of hundreds of thousands of vertices. In US 2005/0288800 a preferred embodiment is disclosed with a pipeline between two ZBT memories that limits the number of vertices of the grid that can be processed per cycle, since these calculations involve the reading of tens or even hundreds of variables, including those of their own vertex and all its neighbours.

A system allowing a quick execution of scientific codes such as the fluid dynamics codes used in the aeronautic industry that involve grids of tens or hundreds of millions of vertices and codes such as Reynolds-Averaged Navier-Stokes (RANS) is therefore desirable.

The present invention is addressed to the attention of this demand.

SUMMARY OF THE INVENTION

It is an object of the present invention to provide a system for accelerating the execution a given scientific code, particularly a CFD code, using a suitable finite-volume or finite-element solver for a large dataset represented as a grid.

This and another objects are met by a system comprising a plurality of equal computing nodes and a front-end node, all of them interconnected by node communication means, and a parallel computing software package for distributing the execution of said scientific code in sub-grids of said grid among said computing nodes, wherein:

each computing node comprises at least a first processing means and a second processing means, which are interconnected by a bus, said first processing means being a CPU (Computer Processing Unit)-based processing means and said second processing means a being FPGA-based processing means;

said parallel computing software package is configured for the simultaneous execution of at least one first solver process and one second solver process of said scientific code in each computing node, where each solver process solves at least one sub-grid of said grid, and for managing the exchange of boundary data between the first and second solver processes that compute neighbour sub-grids after each step of the solver;

said first solver process is fully executed in a first processing means and said second solver process is executed in a second processing means with the collaboration of a first processing means for loading and unloading the sub-grid and the exchange of boundary data (but no collaboration exists in the computations for the numerical method, which are exclusively performed at the second processing means); and said first and second solver processes have the same communication interface for exchanging boundary data with the first and second solver processes that solve neighbour sub-grids.

In an embodiment, the system further comprises software means for partitioning the grid in sub-grids according to the computing capability of the first and second processing means of each computing node and for balancing the computing load so that the differences between the execution times of said first and second solver processes are minimized. Hereby it is achieved a system optimizing the performance of the hardware means.

In an embodiment, a second solver process implements all solver-related computations on a second processing means and the only data exchanged by said second processing means after each solver step with other first or second processing means are sub-grid boundary data. Hereby it is achieved a system where the computing performance of the second processing means (that allow quicker executions of the scientific code than the first processing means) is maximised.

In an embodiment, at least in one computing node a second solver process is configured for executing the scientific code for a sub-grid in sequential steps for chunks of the sub-grid. Hereby it is achieved a system allowing the adaptation of the computing capability of a second processing means to the size of the sub-grid being assigned to it.

Advantageously, said node communication means comprise a high speed and low latency network and a high performance switch for switching said network and a conventional network.

Advantageously, a first processing means comprises one multicore CPU and a local memory and a second processing means comprises a FPGA-based processor and a local memory.

In one embodiment, a computing node comprises one first processing means and one second processing means interconnected by a high-speed, general-purpose bus. Hereby it is achieved a system allowing an accelerate execution of a scientific code using conventional computers as computing nodes.

In one embodiment, a computing node comprises at least two first processing means and two second processing means interconnected by a CPU-specific bus. Hereby it is achieved a system allowing an accelerate execution of a scientific code using computing nodes adapted to the needs of the system.

Advantageously, a second processing means is capable of storing a whole sub-grid in the internal memory of the FPGA-based processor or in its local memory.

The system according to this invention is addressed to an accelerated execution of computational complex physics simulations using finite element or finite volume solvers where the grid has more than $10^8$ vertices and the sub-grids have a number of vertices comprised between $10^5$ and $10^8$, particularly to the execution of CFD codes (RANS equations or Euler equations) for aerodynamic applications.

Other characteristics and advantages of the present invention will be clear from the following detailed description of embodiments illustrative of its object in relation to the attached figures.

DETAILED DESCRIPTION OF THE INVENTION

The system for solving the equations of a given scientific code for a large dataset represented as a grid according to the present invention combines hardware and software means that will be now detailed described.

The Hardware Means

Figure 1:
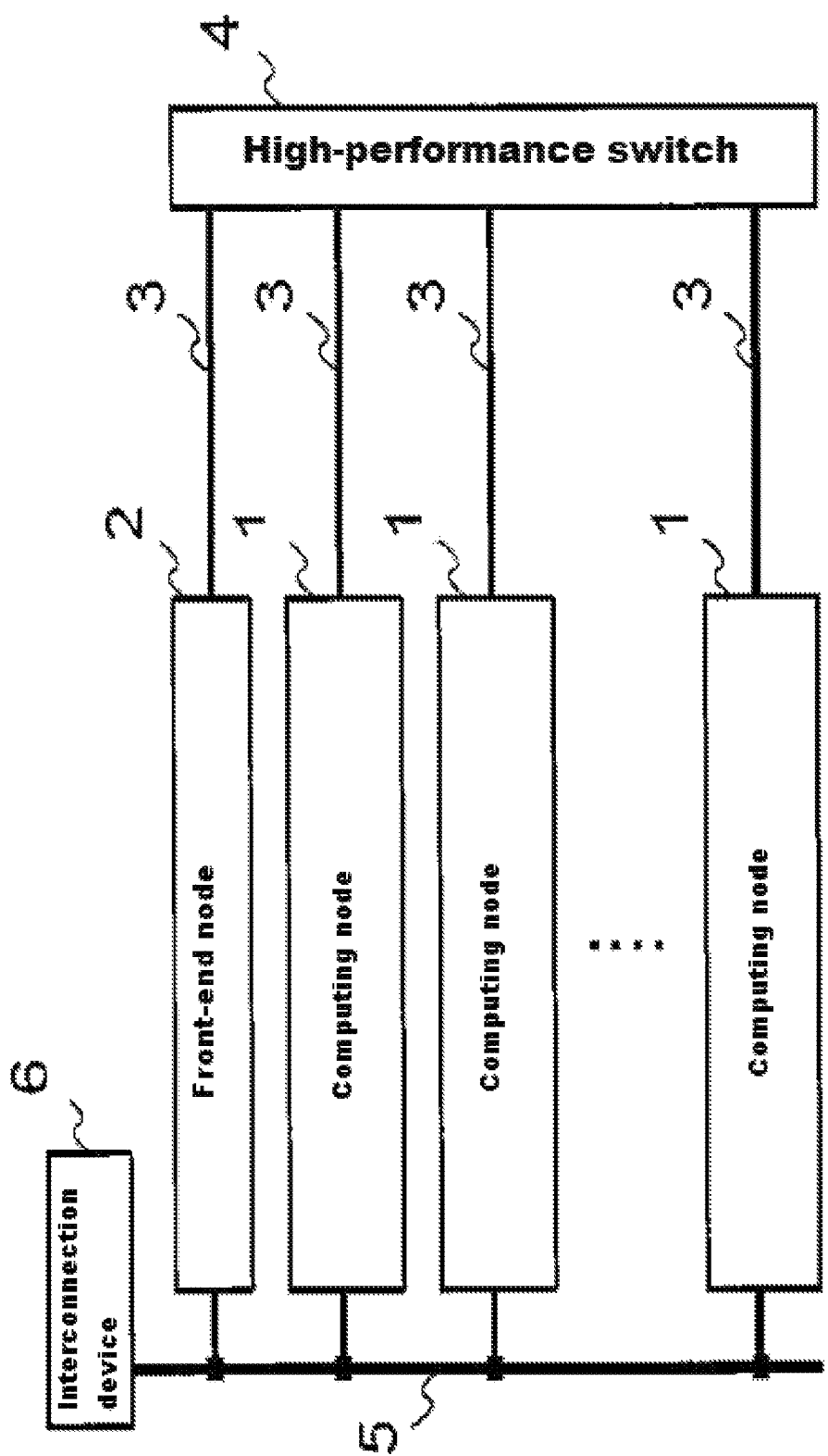
FIG. 1 is a schematic block diagram of a system for solving the equations of a given scientific code for a large dataset represented as a grid according to the present invention.

As hardware means, also referred to as computing means in this specification, the system comprises (see FIG. 1) a plurality of equal computing nodes 1 and a front-end node 2, all connected through a high-speed and low-latency network 3 (such as Infiniband). Such network 3 provides data exchange between the computing nodes 1, so in order to minimize communication bottlenecks in the execution of the algorithm, the computing nodes 1 are connected through a non-blocking, high-performance switch 4. The computing nodes 1 are also connected through a conventional network 5, such as gigabit Ethernet, which is mainly used for management. For this conventional network 5 there is no need to specify a particular interconnection topology, since performance will not generally be a major problem. Finally, the conventional network 5 can be connected to an external network using an interconnection device 6 such as a router or a switch.

Figure 2:
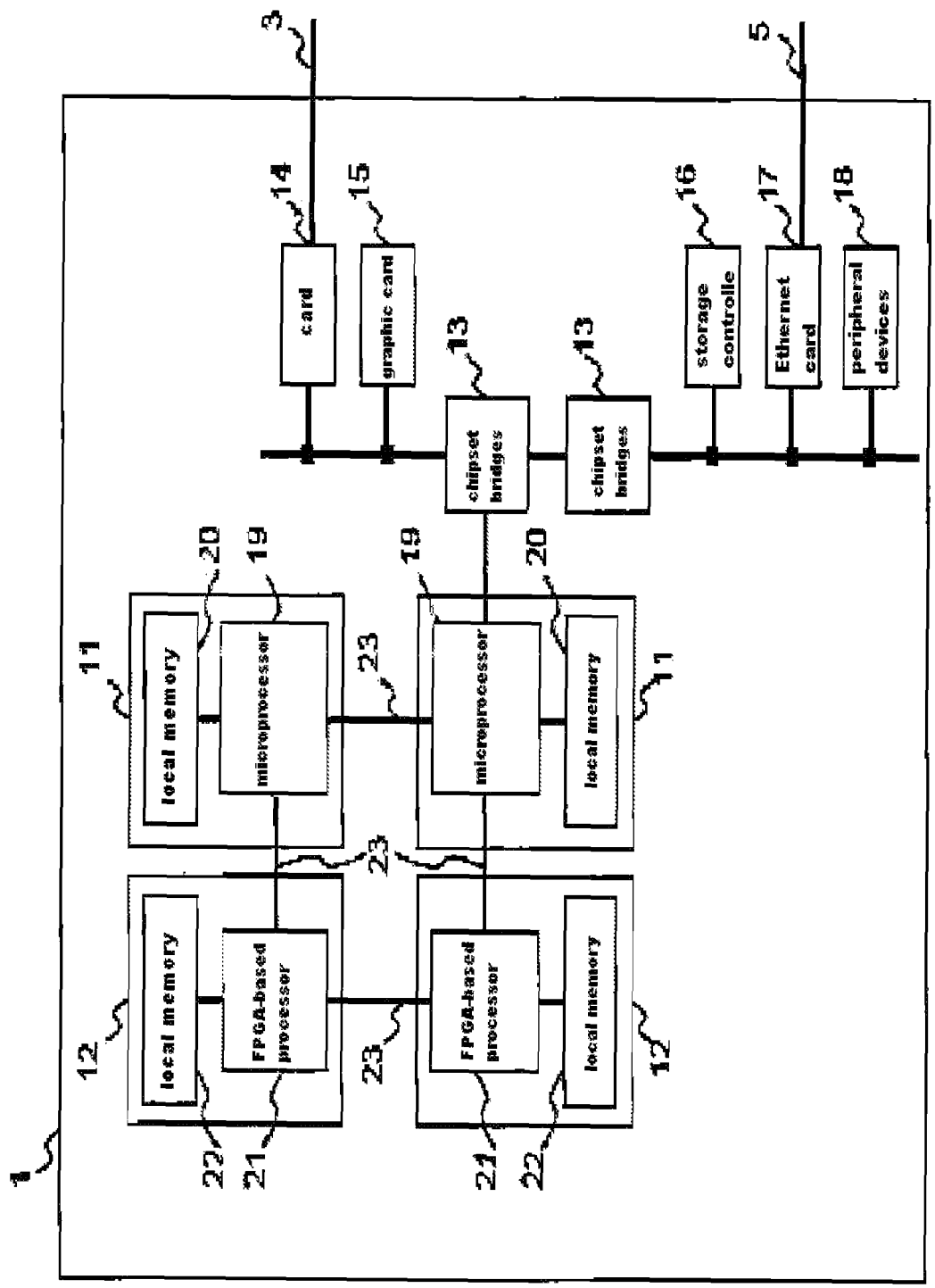
FIG. 2 is a schematic block diagram of one embodiment of a computing node of said system.

FIG. 2 shows an embodiment of a computing node 1 comprising two first processing means 11, two second processing means 12 and a set of standard components such as chipset bridges 13, a storage controller 16 attached to storage media such as hard disks or optical drives, an Ethernet card 17, a specific card 14 for said high-speed network and low latency network 3, a graphic card 15 and additional peripheral devices 18.

A first processing means 11 comprises one conventional microprocessor 19, typically multicore CPUs, and a local memory 20, typically one or more banks of high-speed DRAM memory.

A second processing means 12 comprises one FPGA-based processor 21, and its local memory 22, typically one or more banks of high-speed SRAM or DRAM memory, either off-chip or embedded into the FPGA silicon. A second processing means 12 may appear as an In-Socket Accelerator (device that plugs into a CPU socket of the computer motherboard) or as an expansion card (which plugs into the expansion slots of the computer motherboard).

The first processing means 11 and the second processing means 12 are connected using a CPU-specific bus 23 such as QPI (QuickPath Interconnect) or HyperTransport.

Figure 3:
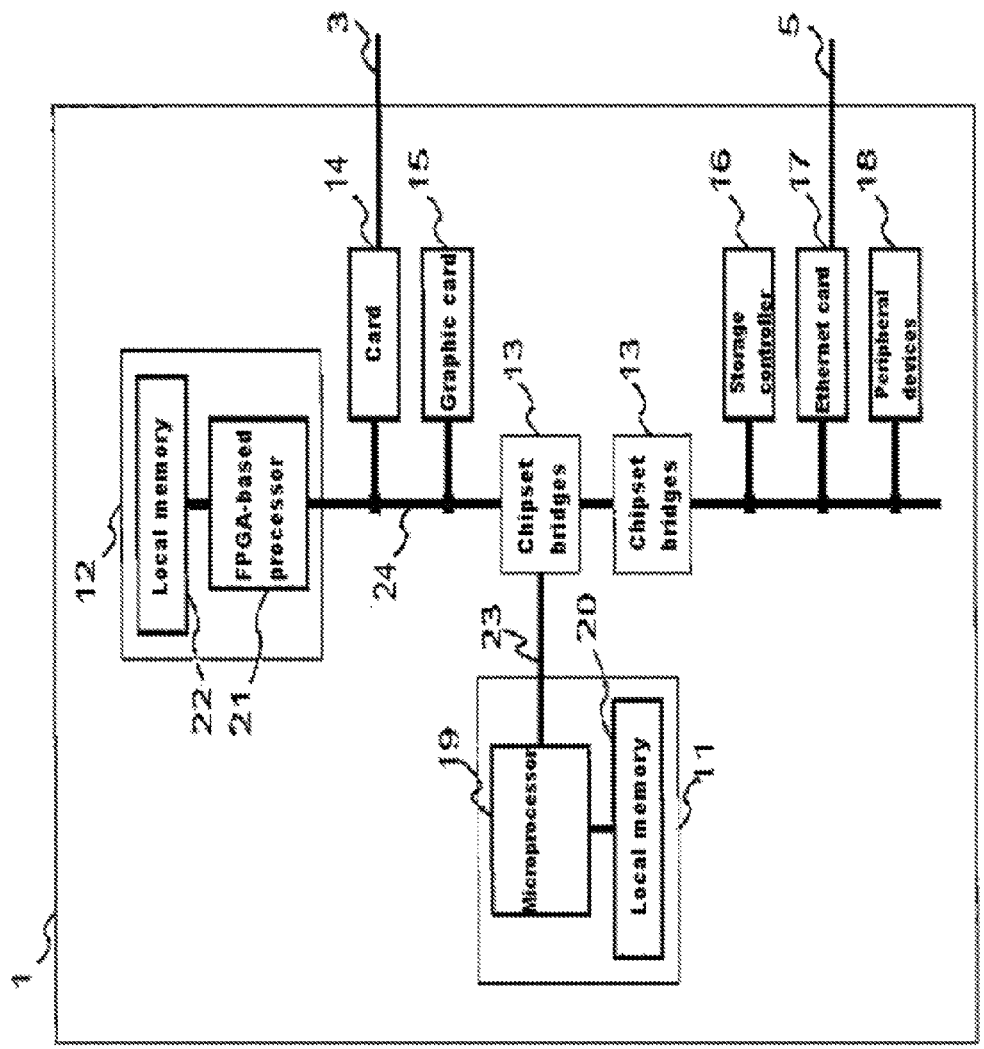
FIG. 3 is a schematic block diagram of another embodiment of a computing node of said system.

FIG. 3 shows an embodiment of a computing node 1 comprising one first processing means 11, one second processing means 12 and the same set of standard components of the previous embodiment. In this case the second processing means 12 is connected through a general-purpose, high-speed PCIe bus 24. This PCIe bus 24 is connected to the first processing means 11 via a chipset bridge 13, which translates between the PCIe bus 24 and the CPU-specific bus 23 used by the first processing means 11.

Figure 4:
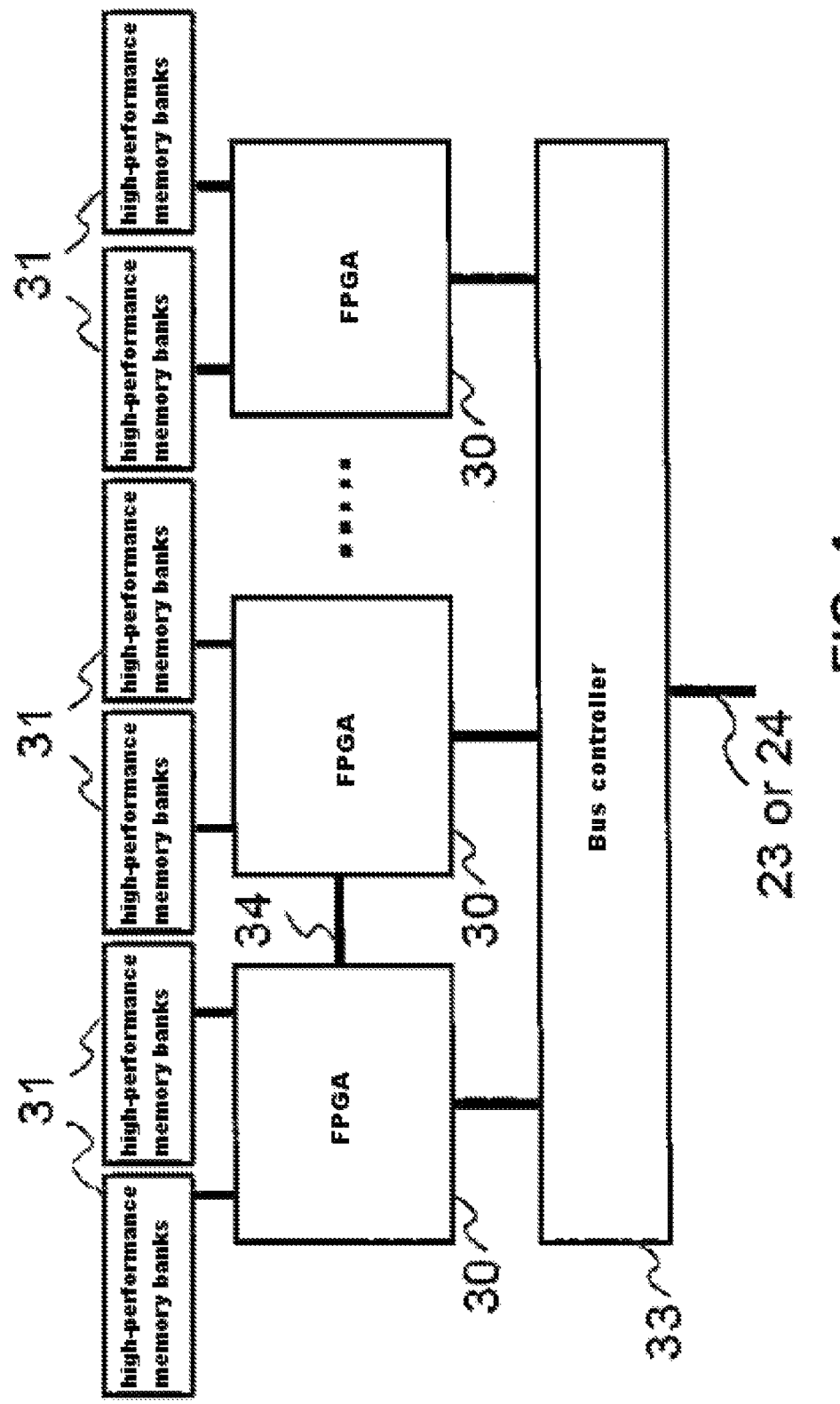
FIG. 4 is a schematic block diagram of a second processing means of a computing node of said system.

FIG. 4 shows an embodiment of a second processing means 12 comprising a plurality of FPGAs 30, each of them with two high-performance memory banks 31. These memories 31 can be external, using technologies such as QDR-II+ SRAM or DDR3 DRAM, or can be embedded into the FPGA silicon, such as in the case of Xilinx BlockRAM memories. The FPGAs 30 are connected to a communication bus via a bus controller 33, which might be a separate device or might be embedded in the FPGA silicon. The communication bus can be the general-purpose, high-speed bus 24 in the embodiment illustrated in FIG. 3, where the second processing means 12 has an expansion card format, or the CPU-specific bus 23 in the embodiment illustrated in FIG. 2 where the second processing means 12 has an ISA format.

The above-mentioned embodiments of the computing nodes 1 have in common that they follow a NUMA (Non-Uniform Memory Access) architecture, where all processing means have a local memory. This feature allows, on the one hand, the storage of a sub-grid in each processing means and, on the other hand, that all processing means are capable of executing the whole solver for its own sub-grid.

The Software Means

The main tasks to be performed by the software means of the system for solving the equations of a given scientific code for a large dataset represented as a grid according to the present invention are the following:

Firstly, the original grid is partitioned and preprocessed. The original grid may be composed of tens or hundreds of millions of vertices and shall be divided in a number of sub-grids consistent with the number of processing means 11, 12 in the system and its computing power. This task is performed in the first processing means 11 using a parallel partitioner such as parMETIS or Zoltan and is only necessary for executions of the scientific code for a new grid. Such partitioning should be done in collaboration with a load balancing task, in order to ensure that the size of sub-grids matches the computational power of the processing means 11, 12, so that the differences of execution time of each solver step among all processing means 11, 12 are minimized. The partitioned grid may be stored in any of the storage locations available to the system, and it can be re-used for new executions of the scientific code under different initial conditions. The sub-grids should be preprocessed before the actual computations can take place. This preprocessing stage includes, but is not limited to, the calculation of geometries, computation of coarser grids for a multi-grid approach, and grid reordering in order to enhance locality of memory accesses. Preprocessed grids may also be saved in any of the storage locations available to the system, so they can be re-used for new executions of the scientific code under different initial conditions. These two steps are not part of the CFD solver, but are required by the solver processes in order to start their execution.

Each computing node 1 runs two types of solver processes: a first solver process where all computations are performed in a first processing means 11 and a second solver process where the all computations are performed in the second processing means 12 and the first processing means 11 is just used for loading/unloading the sub-grid and exchanging the values of the variables for the boundary vertices after each solver step.

In one embodiment, at least one first solver process and one second solver process per computing node 1 will be running in the system. Solver processes exchange boundary data through the high-speed and low-latency network 3 when they are running on different computing nodes 1, and through the local memories 20, 22 when they are running in the same computing node 1.

Each solver process computes one or many of the sub-grids, and after each algorithm step, it exchanges boundary data with the solver processes that are computing neighbor sub-grids. While the first and second solver processes are implemented in a very different way, the communications interface remains the same for them, so any given solver process is not able to tell whether its neighbors are first or second solver processes.

Communication between solver processes is implemented using protocols and/or programming models oriented towards parallel computing.

In one embodiment, a communication model based on message passing, such as MPI, can be used.

In another embodiment, a programming model based on PGAS (Partitioned Global Address Space) to implement the inter-process communication can be used.

In both cases the actual data exchange will take place through the high-speed and low-latency network 3 when they are running on different computing nodes 1, and through the local memories 20, 22 when they are running in the same computing node 1.

First and second solver processes may execute the same or different algorithms, depending on whether multi-zonal decomposition is employed or not. For example, in one embodiment, all first and second solver processes would compute an algorithm to solve the RANS equations. But in another embodiment, some first and second solver processes would compute an algorithm to solve Euler equations, but other first and second solver processes would run an algorithm to solve the RANS equations. In such multi-zonal approach, the most complex algorithms are used only in those areas of the grid where the physics of the problem requires them, thus easing the overall computational requirements needed to solve the whole grid.

First and second solver processes may compute one or more sub-grids. In the latter case, boundary data between sub-grids being computed in the same solver process is exchanged using the local memory 20 in the case of a first solver process or using a direct FPGA 30-to-FPGA 30 connection 34 in the case of a second solver process.

For example, in one embodiment for a first solver process, a programming model based on multi-threading and shared memory such as OpenMP to implement data exchange between sub-grids in the same process can be used.

In another embodiment for a first solver process, a programming model based on PGAS to implement such data exchange can be used. The advantage in this case is that the same model would be used for data exchange between sub-grids both being computed in the same solver process and in different solver processes.

In any case, the number of sub-grids being computed in one first solver process shall be consistent with the number of processor cores of the first processing means 11 reserved to that solver process.

On the other hand, in an embodiment for a second solver process which computes several sub-grids, several FPGAs 30 will be used, each running one instance of the solver kernel in order to compute one sub-grid. Data exchange between sub-grids being computed in the same solver process will take place via the high-speed links 34 between FPGAs 30, using for example high-speed serial links and the Aurora protocol.

Figure 5:
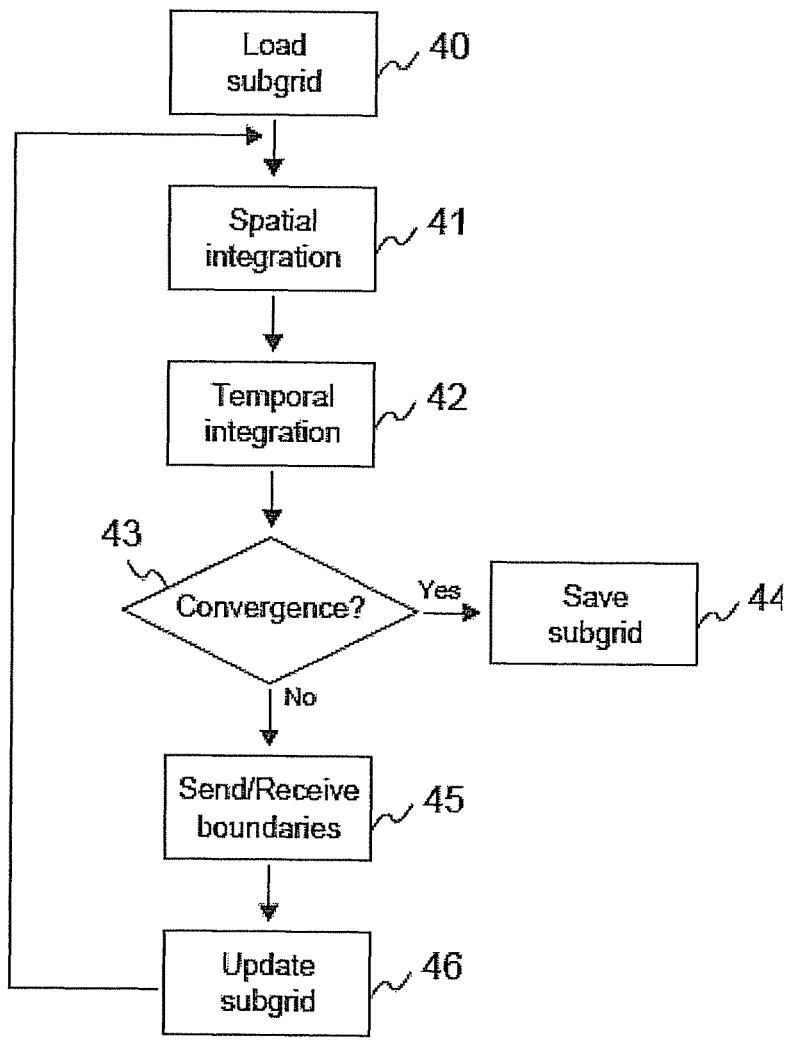
FIG. 5 is a schematic block diagram of a first solver process of the parallel computing software package of said system.

FIG. 5 shows the execution flow for a first solver process. The Figure represents one execution thread, which solves one sub-grid in a first processing means 11.

It starts (step 40) by loading a preprocessed sub-grid. Each step of the algorithm consists of a spatial integration (step 41) and a temporal integration (step 42). After the temporal integration, if the convergence criterion has been reached (step 43), the solver process is finished and the calculated sub-grid is stored (step 44). If not, boundary data is exchanged with neighboring sub-grids (step 45), and the sub-grid is updated with the received data from neighbours (step 46).

Figure 6:
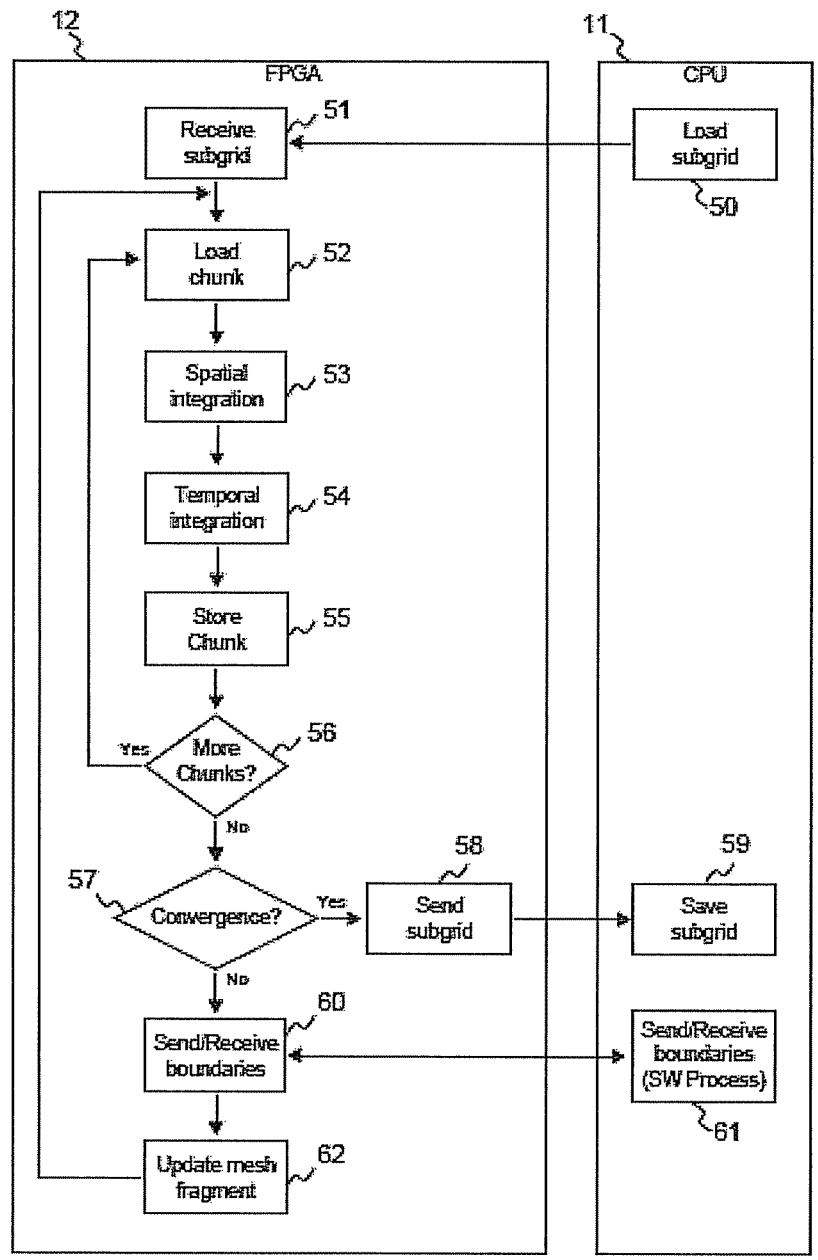
FIG. 6 is a schematic block diagram of a second solver process of the parallel computing software package of said system.

FIG. 6 shows the execution flow for a second solver process. The Figure represents one execution thread, which solves one sub-grid in a computing node 1, all the computing tasks being assigned to a second processing means 12 and the communication tasks to a first processing means 11.

It starts (step 50) with the upload of the preprocessed sub-grid by the first processing means 11, which send it to the second processing means 12, which is waiting to receive it and stores it in its local memory 22 (step 51).

Since it is generally not possible to store the whole sub-grid in the second processing means 12, it is processed in small chunks of up to tens of thousands of vertices, depending on the size of the embedded memory of the second processing means 12. First (step 52), a chunk is loaded from the memory 22 into the second processing means 12, and its vertices are computed by means of a spatial and a temporal integration (steps 53, 54). The processed chunk is saved in the memory 22 (step 55) and if more chunks are available (step 56) the process is repeated. If not, the convergence criterion is checked (step 57), and if it has been reached, the calculated sub-grid is sent (step 58) to the first processing means 11 where it is stored (step 59). If convergence has not been attained (step 57), the next step in the algorithm starts by sending and receiving the boundary data (step 60) in collaboration with the first processing means 11 (step 61). After having received the boundary data, the sub-grid stored in the second processing means 12 is updated (step 62) and a next step of the algorithm starts.

Example

An embodiment of the present invention could be implemented using HTG-V6-PCIE-S475-2 boards from Hitech-Global as second processing means 12. The SuperServer 1026GT-TF-FM209 from SuperMicro can host up to two of these boards and up to two Xeon 5600 processors, thus creating a computing node 1 that has two first processing means 11 and two second processing means 12. In such configuration, a second solver process executed in the second processing means 12 will typically run 3 times faster than a first solver process running concurrently on the six cores of a Xeon 5600 processor installed in said SuperMicro node 1. Therefore, a 4× speedup factor can be obtained in respect to a CPU-only parallel solution. Said FPGA processing boards used as second processing means feature a 2 GB DDR memory, which may fit sub-grids up to $10^7$ vertices. A grid of $10^8$ vertices could be solved on a system with four of said SuperMicro computing nodes 1.

Although the present invention has been described in connection with various embodiments, it will be appreciated from the specification that various combinations of elements, variations or improvements therein may be made, and are within the scope of the invention.

REFERENCES

[1] Diego Sanchez-Roman et al., "In-socket Acceleration for CFDs using High Level Languages", Jornadas sobre Computación Reconfigurable y Aplicaciones (JCRA) 2010.

[2] V. G. Asouti et al., "Unsteady CFD computations using vertex-centered finite volumes for unstructured grids on Graphics Processing Units", International Journal for Numerical Methods in Fluids, 2010.

The invention claimed is:

1. A system for executing a given scientific code using a suitable finite-volume or finite-element solver for a large dataset represented as a grid, comprising a plurality of equal computing nodes and a front-end node, all of them interconnected by node communication, and a parallel computing software package for distributing the execution of said scientific code in sub-grids of said grid among said computing nodes, wherein:

each computing node comprises at least a first processor and a second processor, which are interconnected by a bus, said first processor being a CPU-based processor and said second processor being a FPGA-based processor;

said parallel computing software package being configured for simultaneous execution of at least one first solver process and one second solver process of said scientific code in each computing node, where each solver process solves at least one sub-grid of said grid, and for managing the exchange of boundary data between the first and second solver processes that compute neighbour sub-grids after each step of the solver;

wherein said first solver process is fully executed in the first processor and said second solver process is executed in the second processor with the collaboration of the first processor for loading and unloading the sub-grid and the exchange of boundary data; and wherein said first and second solver processes have the same communication interface for exchanging boundary data with the first and second solver processes that solve neighbour sub-grids.

2. A system according to claim 1, further configured for partitioning the grid in sub-grids according to the computing capability of the first and second processors of each computing node and for balancing the computing load so that the differences between the execution times of said first and second solver processes are minimized.

3. A system according to claim 1, wherein a second solver process implements all solver-related computations on the second processor and the only data exchanged by the second processor after each solver step with other first or second processor are sub-grid boundary data.

4. A system according to claim 1, wherein at least in one computing node a second solver process is configured for executing the scientific code for a sub-grid in sequential steps for chunks of the sub-grid.

5. A system according to claim 1, wherein said node communication comprises a high speed and low latency network and a high performance switch for switching said network, and a conventional network.

6. A system according to claim 1, wherein the first processor comprises one multicore CPU and a local memory and the second processor comprises a FPGA-based processor and a local memory.

7. A system according to claim 6, wherein a computing node comprises one first processor and one second processor interconnected by a high-speed, general-purpose bus.

8. A system according to claim 6, wherein a computing node comprises at least two first processors and two second processors interconnected by a CPU-specific bus.

9. A system according to claim 7, further comprising: a chipset bridge, a card for said high-speed and low latency network and an Ethernet card for said conventional network.

10. A system according to claim 7 wherein the second processor is capable of storing a whole sub-grid in the internal memory of the FPGA-based processor or in its local memory.

11. A system according to claim 1, wherein said grid has more than $10^8$ vertices and the sub-grids have a number of vertices comprised between $10^5$ and $10^8$.

12. A system according to claim 1, wherein said scientific code is a CFD code and said dataset is the grid of an object that moves through a fluid medium.

13. A system according to claim 12, wherein the scientific code comprises at least two sets of equations for at least two zones of the grid and said first and second solver processes use said two set of equations for the sub-grids of said two zones.

14. A system according to claim 13, wherein said two sets of equations are the Euler equations and the RANS equations.

15. A system according to claim 12, wherein said object is an aircraft or a component of an aircraft.

* * * * *